US006600357B1

United States Patent
Kirihara

(10) Patent No.: US 6,600,357 B1
(45) Date of Patent: Jul. 29, 2003

(54) HIGH VOLTAGE LEVEL SHIFTER

(75) Inventor: Masaharu Kirihara, Beacon, NY (US)

(73) Assignee: Halo LSI, Inc., Wappingers Falls, NY (US)

(*) Notice: Subject to any disclaimer, the term of this patent is extended or adjusted under 35 U.S.C. 154(b) by 0 days.

(21) Appl. No.: 10/106,944

(22) Filed: Mar. 26, 2002

Related U.S. Application Data

(60) Provisional application No. 60/279,152, filed on Mar. 27, 2001.

(51) Int. Cl.[7] .................................. H03K 19/0185
(52) U.S. Cl. .................................. 327/333; 326/81
(58) Field of Search .................... 327/333; 326/80, 326/81

(56) References Cited

U.S. PATENT DOCUMENTS

| | | | | | |
|---|---|---|---|---|---|
| 3,942,043 | A | * | 3/1976 | Sirocka et al. | 327/333 |
| 5,444,396 | A | * | 8/1995 | Soneda | 326/81 |
| 6,043,699 | A | * | 3/2000 | Shimizu | 327/333 |
| 6,064,229 | A | * | 5/2000 | Morris | 326/81 |

* cited by examiner

Primary Examiner—Toan Tran
(74) Attorney, Agent, or Firm—George O. Saile; Stephen B. Ackerman

(57) ABSTRACT

According to the present invention, a voltage level shifter with smaller size and less latch-up probability is described, in which extra two N-MOS transistors and two P-MOS transistors are added. The extra transistors help node voltages increase or decrease appropriately, and then the size of driving transistors can be small. As a result, the total size of the layout can be smaller. In addition, the voltage increasing or decreasing done by the extra transistors reduce a voltage bouncing which call cause latch-up.

27 Claims, 3 Drawing Sheets

HIGH VOLTAGE LEVEL SHIFTER

This application claims the benefit of Provisional application No. 60/279,142, filed Mar. 27, 2001.

BACKGROUND OF THE INVENTION

1. Field of the Invention

The present invention generally relates to digital signal level shifters. More particularly, a digital signal voltage level circuit which is designed for higher density and more reliable operation without the problems of voltage bouncing and latch-up.

2. Description of the Prior Art

In the prior art, MOS transistors of which a voltage level shifter consists are connected to a node or the other node. The mechanism of a voltage level shifter is based on a feedback from the voltage of the node to the voltage of the other node. Thus a MOS transistor driving the node where the feedback starts should be strong, and then the size of the layout becomes large. And a low signal is input to the gate of an NMOS transistor where the drain is already low level, and then the voltage of the drain goes down to less than the low level through capacitor coupling of the gate capacitor. Thus a latch-up can be happen in the NMOS transistor.

SUMMARY OF THE INVENTION

It is therefore an object of the present invention to provide a circuit and a method for level shifting a digital voltage signal. It is further an object of this invention to achieve this digital signal voltage level shifter with the fastest speed, smallest density and less latch-up probability. This invention is achieved by a circuit with two extra NMOS and two extra PMOS transistors compared with the prior voltage level shifter. The extra transistors are used for avoiding floating of nodes which happens when an input of the voltage level shifter is being changed. Because of the extra transistors, a feedback which is a basic mechanism of a voltage level shifter works well, then smaller transistors call be used. Moreover, a voltage bouncing which causes latch-up can be reduced in the voltage level shifter circuit of the present invention because the extra transistors pull up or down node voltages in the opposite direction of voltage bouncing caused by capacitor coupling in other MOS transistors.

The above and other objects, features and advantages of the present invention will be better understood from the following detailed description taken in conjunction with the accompanying drawings.

DESCRIPTION OF THE PREFERRED EMBODIMENT

Figure 1:
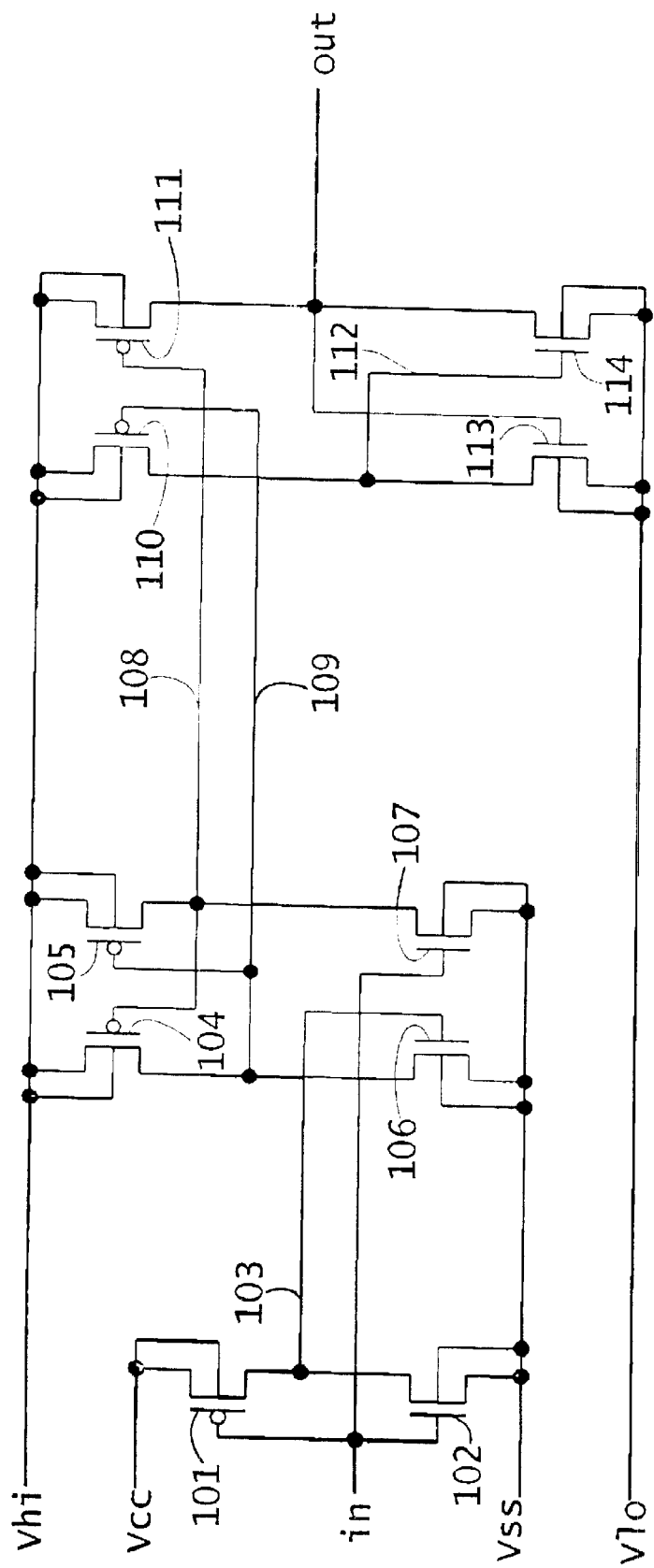
FIG. 1 shows a circuit diagram of a prior art voltage level shifter.

In FIG. 1 is shown a voltage level shifter circuit. An input "in" is connected to the gate of an NMOS transistor 107 and the gates of a PMOS transistor 101 and NMOS transistor 102 constituting the inverter. The source of the PMOS transistor 101 is connected to a power supply voltage Vcc, while the source of the NMOS transistor 102 is connected to a ground Vss. The drains of the two MOS transistors 101 and 102 are connected to each other to form a node 103.

This node 103 is connected to the gate of an NMOS transistor 106. The sources of the two NMOS transistors 106 and 107 are connected to the ground Vss. The drain of the NMOS transistor 106 forms a node 109 and is connected to the drain of a PMOS transistor 104 and to the gate of a PMOS transistor 105. The drain of the NMOS transistor 107 forms a node 108 and is connected to the drain of tile PMOS transistor 105 and to the gate of the PMOS transistor 104. The sources of the two PMOS transistors 104 and 105 are connected to a high voltage Vhi.

The node 108 is connected to the gate of a PMOS transistor 111. The node 109 is connected to the gate of a PMOS transistor 110. The sources of the two PMOS transistors 110 and 111 are connected to the high voltage Vhi. The drain of the PMOS transistor 110 forms a node 112 and is connected to the drain of an NMOS transistor 113 and to the gate of an NMOS transistor 114. The drain of the PMOS transistor 111 forms an output terminal "out" and is connected to the drain of the NMOS transistor 114 and to the gate of the NMOS transistor 113. The sources of the two NMOS transistors 113 and 114 are connected to a low voltage Vlo.

In FIG. 1, operation of the voltage level shifter circuit in the main embodiment is explained. When a signal of the level Vcc is input to the input terminal "in", the level of the input signal is inverted by the inverter consisting of the MOS transistors 101 and 102 then the voltage of the node 103 is Vss. Then, the NMOS transistor 107 is opened and the voltage of the node 108 goes close to Vss. While the NMOS transistor 106 is closed, the node 109 becomes floating. Because the voltage of the node 108 is Vss, the PMOS transistor 104 is opened and the voltage of the node 109 goes up to Vhi. Then, the PMOS transistor 105 is closed and the voltage of the node 108 becomes Vss completely. Note that the voltage levels of the nodes 108 and 109 are different, ie. The voltages of the nodes 108 and 109 are Vss and Vhi, respectively.

The voltages of the nodes 108 and 109 are Vss and Vhi, respectively, so that the PMOS transistor 110 is closed and the PMOS transistor 111 is opened. Then the node 112 becomes floating, and the voltage of the output terminal "out" goes close to Vhi. Therefore the NMOS transistor 113 is opened and the voltage of the node 112 goes down to Vlo. Then, the NMOS transistor 114 is closed and the voltage of the output terminal "out" becomes Vhi completely.

When a signal of the level Vss is input to the input terminal "in", the level of the input signal is inverted by the inverter consisting of the MOS transistors 101 and 102 their the voltage of the node 103 is Vcc. Then, the NMOS transistor 106 is opened and the voltage of the node 109 goes close to Vss. While the NMOS transistor 107 is closed and the node 108 becomes floating. Because the voltage of the node 109 is Vss, the PMOS transistor 105 is opened and the voltage of the node 108 goes up to Vhi. Then the PMOS transistor 104 is closed and the voltage of the node 109 becomes Vss completely. Note that the voltage levels of the nodes 108 and 109 are different, i.e. the voltages of the nodes 108 and 109 are Vhi and Vss, respectively.

The voltages of the nodes 108 and 109 are Vhi and Vss, respectively, so that the PMOS transistor 110 is opened and the PMOS transistor 111 is closed. Then the output terminal "out" becomes floating, and the voltage of the node 112 goes close to Vhi. Therefore the NMOS transistor 114 is opened and the voltage of the output terminal "out" goes down to Vlo. Then the NMOS transistor 113 is closed and the voltage of the node 112 becomes Vhi completely.

In order that the voltage level shifter circuit works well, it is necessary that the NMOS transistor 106 is stronger than the PMOS transistor 104, that the NMOS transistor 107 is stronger than the PMOS transistor 105, that the P-MOS transistor 110 is stronger than the NMOS transistor 113, and that the PMOS transistor 111 is stronger than the NMOS transistor 114. If the NMOS transistor 106 is weaker than the PMOS transistor 104, the voltage of the node 109 doesn't go down enough to Vss when the voltage of the input terminal "in" is Vss so that the voltage of the node 103 is Vcc. Then the P-MOS transistor 105 doesn't open enough to make the voltage of the node 108 go up to Vhi. Then the voltage of the node 108 is still close to Vss, and the PMOS transistor 104 keeps open so that the voltage of the node 109 is kept close to Vhi. This means that the voltages of the nodes 108 and 109 don't change to each inverted level, that the voltage of the output terminal "out" isn't changed and that the voltage level shifter doesn't work well in a meaningful time although those voltages of the nodes 108 and 109 might be changed after a long time. The same rule can be applied if the NMOS transistor 107 is weaker than the PMOS transistor 105 when the voltage of the input terminal "in" is Vdd.

If the PMOS transistor 110 is weaker than the NMOS transistor 113, the voltage of the node 112 doesn't go up enough to Vhi when the voltages of the nodes 108 and 109 are Vhi and Vss, respectively. Then the NMOS transistor 114 doesn't open enough to make the voltage of the output terminal "out" go down to Vlo. Then the voltage of the output terminal "out" is still close to Vhi, and the NMOS transistor 113 keeps open so that the voltage of the node 112 is kept close to Vlo. This means that the voltages of the node 112 and the output terminal."out" doesn't change to each inverted level and that the voltage level shifter doesn't work, well in a meaningful time although those voltages of the node 112 and the output terminal "out" might be changed after a long time. The same rule can be applied if the PMOS transistor 111 is weaker than the NMOS transistor 114 when the voltage of the nodes 108 and 109 are Vss and Vhi, respectively.

Typically, the minimum length in a design rule is usually a length of a transistor used in a voltage level shifter circuit. Thus if a stronger transistor is needed, a transistor with large width is used and then a large area is necessary to make a layout of the voltage level shifter circuit.

Another problem can happen. When the voltage of the input "in" changes from Vcc to Vss, the voltage of the node 108 changes from the initial voltage of Vss to Vhi through the voltage less than Vss because of a capacitor coupling between the gate and the drain (i.e. the node 108) in the NMOS transistor 107. Especially the gate of the NMOS transistor 107 should be large as described above, then the effect of the capacitor coupling is relatively large and the large voltage bouncing makes a problem of latch-up in the NMOS transistor 107 in which the substrate is connected to Vss.

The same latch-up problem can happen in the NMOS transistor 106 when the voltage of the input "in" changes from Vss to Vcc. And the same latch-up problem can happen in the PMOS transistors 110 and 111 because the voltages of the node 112 and the output terminal "out" go up to more than Vhi for a short time when the voltage of the nodes 108 and 109 are changed.

Figure 3:
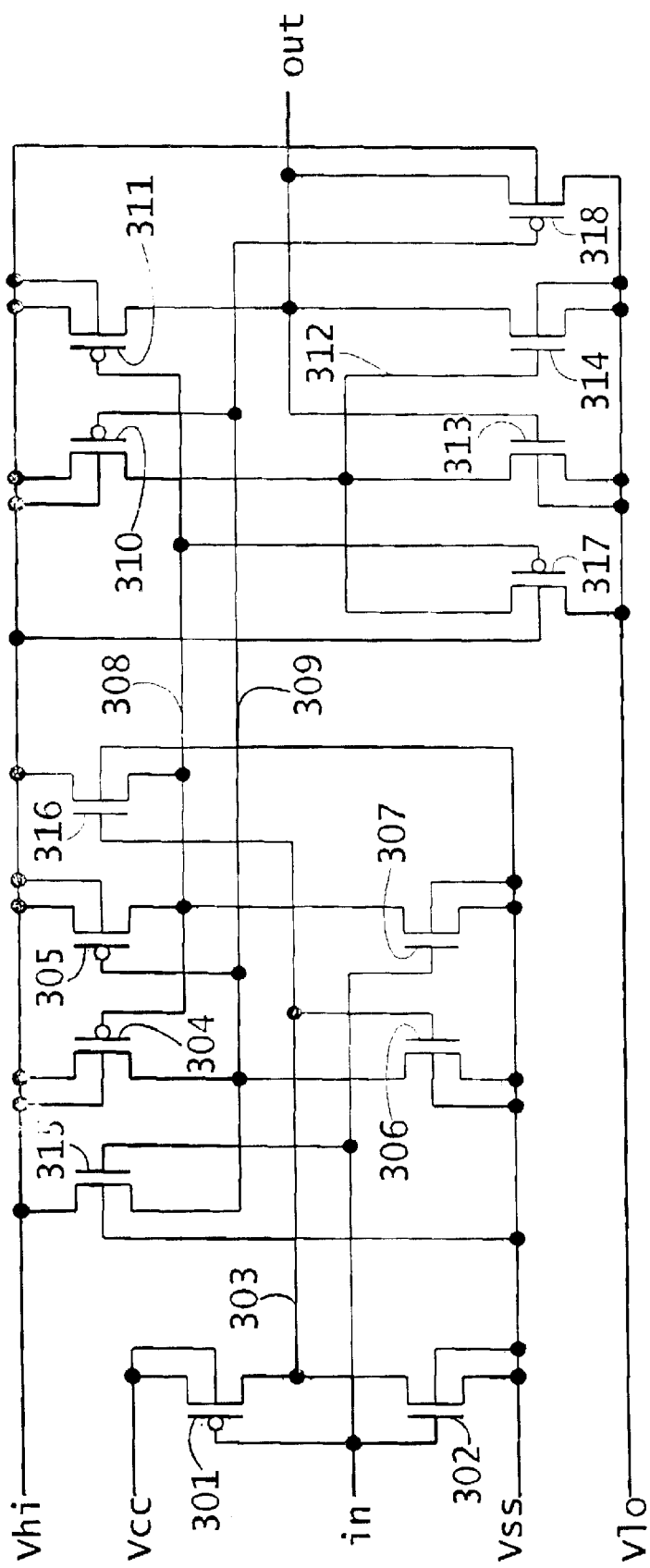
FIG. 3 is a circuit diagram of a voltage level shifter according to the present invention.

FIG. 3 shows a voltage level shifter circuit with smaller area size and less latch-up probability. An input "in" is connected to the gates of NMOS transistors 307 and 315 and the gates of a PMOS transistor 301 and NMOS transistor 302 constituting the inverter. The source of the PMOS transistor 301 is connected to a power supply voltage Vcc, while the source of the NMOS transistor 302 is connected to a ground Vss drains of the two MOS transistors 301 and 302 are connected to each other to form a node 303.

This node 303 is connected to the gates of NMOS transistor 306 and 316. The sources of the two NMOS transistors 306 and 307 are connected to the ground Vss. The drain of the NMOS transistor 306 forms a node 309 and is connected to the drain of a PMOS transistor 304, to the source of the NMOS transistor 315 and to the gate of a PMOS transistor 305. The drain of the NMOS transistor 307 forms a node 308 and is connected to the drain of the PMOS transistor 305, to the source of the NMOS transistor 316 and to the gate of the PMOS transistor 304. The sources of the two PMOS transistors 304 and 305 and the drains of the two NMOS transistors 315 and 316 are connected to a high voltage Vhi.

The node 308 is connected to the gates of PMOS transistors 311 and 317. The node 309 is connected to the gates of PMOS transistors 310 and 318. The sources of the two PMOS transistors 310 and 311 are connected to the high voltage Vhi. The drain of the PMOS transistor 310 forms a node 312 and is connected to the drain of an NMOS transistor 313, to the source of the PMOS transistor 317 and to the gate of an NMOS transistor 314. The drain of the PMOS transistor 311 forms an output terminal "out" and is connected to the drain of the NMOS transistor 314, to the source of the PMOS transistor 318 and to the gate of the NMOS transistor 313: The sources of the two NMOS transistors 313 and 311 and the drains of the two PMOS transistors 317 and 318 are connected to a low voltage Vlo.

Operation of the voltage level shifter circuit with smaller area size and less latch-up probability is explained. When a signal of the level Vcc is input to the input terminal "in", the level of the input signal is inverted by the inverter consisting of the MOS transistors 301 and 302 then the voltage of the node 303 is Vss. Then the NMOS transistors 307 and 315 are opened while the NMOS transistors 306 and 316 are closed. The voltage of the node 308 goes close to Vss and the voltage of the node 309 goes up close to Vcc-Vthn, where Vthn is the threshold voltage of the NMOS transistor 315. Then, the PMOS transistor 304 is opened and the PMOS transistor 305 is almost closed. Then the voltage of the node 309 becomes Vhi completely and then the PMOS transistor 305 is completely closed. As a result, the voltage of the node 308 becomes Vss completely.

The voltages of the nodes 308 and 309 are Vss and Vhi, respectively, so that the PMOS transistors 310 and 318 are closed and the PMOS transistor 311 and 317 are opened. Then the voltage of the output terminal "out" goes close to Vhi and the voltage of the node 312 goes down close to Vss-Vthp, where Vthp is the threshold voltage of the PMOS transistor 317. Then the NMOS transistor 313 is opened and the NMOS transistor 314 is almost closed. Then the voltage of the node 312 becomes Vlo completely, and then the NMOS transistor 314 is completely closed. As a result, the voltage of the output terminal "out" becomes Vhi completely.

Figure 2:
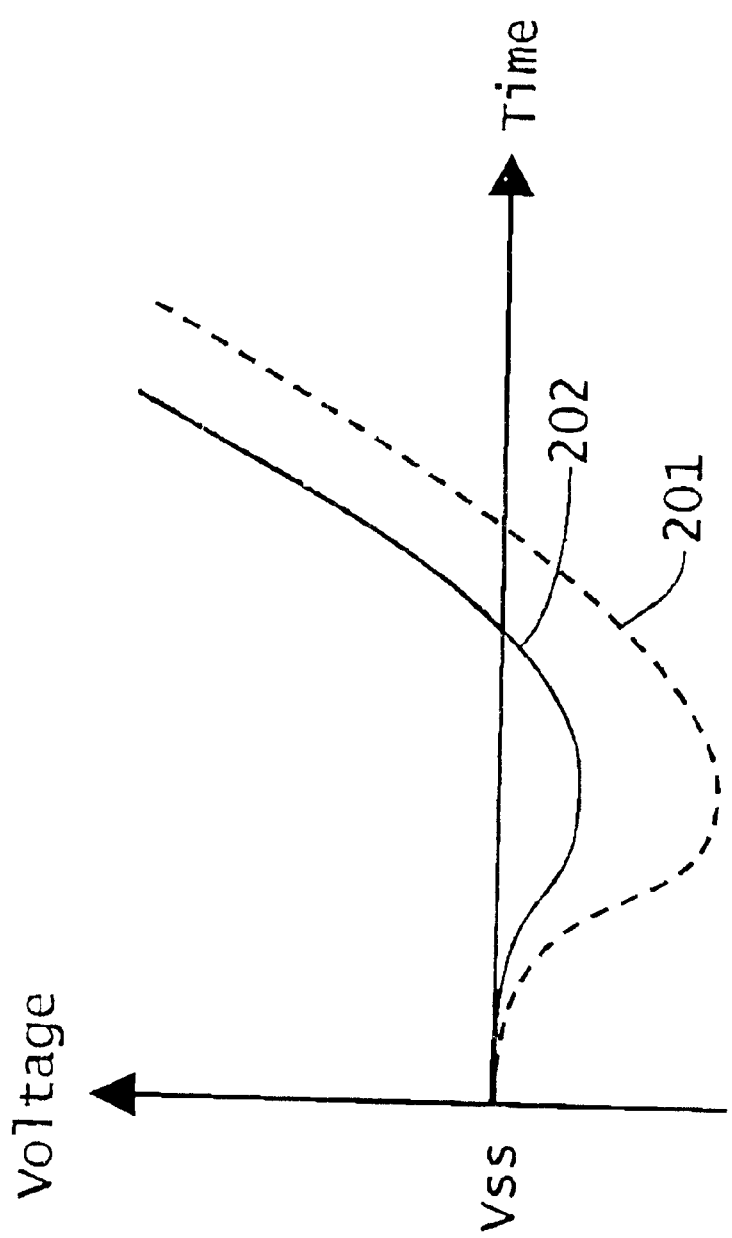
FIG. 2 is a diagram of a node voltage in an NMOS drain.

Compared with the prior voltage level shifter circuit in FIG. 1, the extra NMOS transistor 315 solves the two problem described above. Due to increasing the voltage of the node 309 done by the NMOS transistor 315, the PMOS transistor 305 become weaker. In other words, the NMOS transistor 307 is relatively stronger, and then a strong NMOS transistor which needs a large area in layout is not necessary for the NMOS transistor 307 compared with the prior NMOS transistor 107 in FIG. 1. And a latch-up caused by the voltage below Vss in the node 309 can be avoided because the NMOS transistor 315 makes the voltage of the node 309 increase, as shown in a waveform 202 in FIG. 2. Also, the same rule can be applied to the PMOS transistor 317 with considering switch between NMOS and PMOS characteristics. Due to decreasing the voltage of the node 312 done by the PMOS transistor 317, the NMOS transistor 314 becomes weaker. In other words, the PMOS transistor 311 is relatively stronger, and then a strong PMOS transistor which needs a large area in layout is not necessary for the PMOS transistor 311 compared with the prior PMOS transistor 111 in FIG. 1. And a latch-up caused by the voltage above Vhi in the node 312 can be avoided because the PMOS transistor 317 makes the voltage of the node 312 decrease.

Operation of the voltage level shifter circuit with smaller area size and less latch-up probability in the case of low input level is explained. When a signal of the level Vss is input to the input terminal "in", the level of the input signal is inverted by the inverter consisting of the MOS transistors 301 and 302 then the voltage of the node 303 is Vcc. Then the NMOS transistors 306 and 316 are opened while the NMOS transistors 307 and 315 are closed. The voltage of the node 309 goes close to Vss and the voltage of the node 308 goes up close to Vcc-Vthn, where Vthn is the threshold voltage of the NMOS transistor 316. Then the PMOS transistor 305 is opened and the PMOS transistor 304 is almost closed. Then the voltage of the node 308 becomes Vhi completely and then the PMOS transistor 304 is completely closed. As a result, the voltage of the node 309 becomes Vss completely.

The voltages of the nodes 308 and 309 are Vhi and Vss, respectively, so that the PMOS transistors 311 and 317 are closed and the PMOS transistor 310 and 318 are opened. Then the voltage of the node 312 goes close to Vhi and the voltage of the output terminal "out" goes down close to Vss-Vthp, where Vthp is the threshold voltage of the PMOS transistor 318. Then the NMOS transistor 314 is opened and the NMOS transistor 313 is almost closed. Then the voltage of the output terminal "out" becomes Vlo completely and then the NMOS transistor 313 is completely closed. As a result, the voltage of the node 312 becomes Vhi completely.

Compared with the prior voltage level shifter circuit in FIG. 1, the extra NMOS transistor 316 solves the two problems described above. Due to increasing the voltage of the node 308 done by the NMOS transistor 316, the PMOS transistor 304 becomes weaker. In other words, the NMOS transistor 306 is relatively stronger, and then a strong NMOS transistor which needs a large area in layout is not necessary for the NMOS transistor 306 compared with the prior NMOS transistor 106 in FIG. 1. And a latch-up caused by the voltage below Vss in the node 308 can be avoided because the NMOS transistor 316 makes the voltage of the node 308 increase. Also, the same rule can be applied to the PMOS transistor 318 with considering switch between NMOS and PMOS characteristics. Due to decreasing the voltage of the output terminal "out" done by the PMOS transistor 318, the NMOS transistor 313 becomes weaker. In other words, the PMOS transistor 310 is relatively stronger, and then a strong PMOS transistor which needs a large area in layout is not necessary for the PMOS transistor 310 compared with the prior PMOS transistor 110 in FIG. 1. And a latch-up caused by the voltage above Vhi in the output terminal "out" can be avoided because the PMOS transistor 318 makes the voltage of the output terminal "out" decrease.

This invention provides for a more efficient digital signal voltage level shifting circuit and method. It also leads to a reduction in the silicon area occupied by the level shifting circuit. In addition, it reduces the latch-up problem normally associated with the voltage bouncing mechanism exhibited in the prior art level shifting circuits. Due to the elimination of the above problems, the voltage level shifter of this invention provides more reliable operation than the prior and present art.

While the invention has been described in terms of the preferred embodiments, those skilled in the art will recognize that various changes in form and details may be made without departing from the spirit and scope of the invention.

What is claimed is:

1. A digital signal voltage level shifter circuit with small area and low latch-up probability comprising:

an input stage inverter whose input is a primary input of said voltage level shifter and whose output goes to a middle stage inverter, a middle stage inverter whose inputs come from said primary input and from the output of said input stage, an output stage whose input is from an output of said middle stage and whose output is a primary output of said voltage level shifter, said middle stage inverter further comprising two extra NMOS FET transistor devices to prevent latch-up and to reduce sizes of other devices in said middle stage inverter, and said output stage further comprising two extra PMOS FET transistor devices to prevent latch-up and to reduce sizes of other devices in said output stage.

2. The digital signal voltage level shifter circuit of claim 1 wherein said input stage is made up of a P-metal oxide semiconductor field effect transistor, PMOS FET and a an N-metal oxide semiconductor field effect transistor, NMOS FET.

3. The digital signal voltage level shifter circuit of claim 2 wherein the source of said PMOS FET is connected to a Vcc supply voltage, the gate of said PMOS FET is connected to the primary input and the drain of said PMOS FET is connected to an internal node A, which is the output of said input stage of this voltage level shifter circuit.

4. The digital signal voltage level shifter circuit of claim 3 wherein the source of said NMOS FET is connected to a Vss voltage supply, the gate of said NMOS FET is connected to said primary input of said level shifter circuit, and the drain of said NMOS FET is connected to said internal node A, which is the output of said input stage of this voltage level shifter circuit.

5. The digital signal voltage level shifter of claim 4 wherein said middle stage comprises four NMOS FETs (NMOSFET NA, NMOSFET NB, NMOSFET NC, and NMOSFET ND) and two PMOS FETs (PMOSFET PA and PMOSFET PB).

6. The digital signal voltage level shifter of claim 5 wherein the source of a PMOS FET PA is connected to a voltage supply, Vhi, the gate of said PMOS FET PA is connected to an internal node C, and the drain of said PMOS FET PA is connected to an internal node B.

7. The digital signal voltage level shifter of claim 6 wherein the source of a PMOS FET PB is connected to said voltage supply, Vhi, the gate of said PMOS FET PB is connected to said internal node B and the drain of said PMOS FET PB is connected to said internal node C.

8. The digital signal voltage level shifter of claim 7 wherein the drain of NMOS FET NA is connected to said voltage supply, Vhi, the gate of said NMOS FET NA is connected to said primary input, and the source of said NMOS FET NA is connected to said internal node, B, and wherein said NMOS FET NA is one of said extra devices in said middle stage.

9. The digital signal voltage level shifter of claim 8 wherein the drain of NMOS FET NB is connected to said voltage supply, Vhi, the gate of said NMOS FET NB is connected to said internal node, A, and the source of said NMOS FET NA is connected to said internal node, C, and wherein said NMOS FET NB is one of said extra devices in said middle stage.

10. The digital signal voltage level shifter of claim 9 wherein the drain of NMOS FET NC is connected to said internal node, B, the gate of said NMOS FET NC is connected to said internal node, A, and the source of said NMOS FET NC is connected to said voltage, Vss.

11. The digital signal voltage level shifter of claim 10 wherein the drain of NMOS FET ND is connected to said internal node, C, the gate of said NMOS FET ND is connected to said primary input, and the source of said NMOS FET ND is connected to said voltage, Vss.

12. The digital signal voltage level shifter of claim 11 wherein said output stage is made up of four PMOS FETs and two NMOS FETs.

13. The digital signal voltage level shifter of claim 12 wherein the source of a PMOS FET PC is connected to a voltage supply, Vhi, the gate of said PMOS FET PC is connected to an internal node B, and the drain of said PMOS FET PC is connected to an internal node D.

14. The digital signal voltage level shifter of claim 13 wherein the source of a PMOS FET PD is connected to a voltage supply, Vhi, the gate of said PMOS FET PD is connected to said internal node C, and the drain of said PMOS FET PD is connected to said primary output of the voltage level shifter circuit.

15. The digital signal voltage level shifter of claim 14 wherein the source of a PMOS FET PE is connected to said internal node D, the gate of said PMOS FET PE is connected to said internal node C, and the drain of said PMOS FET PE is connected to a voltage, Vlo, wherein said PMOS FET PE is one of said extra devices in said output stage.

16. The digital signal voltage level shifter of claim 15 wherein the source of a PMOS FET PF is connected to said primary output of the voltage level shifter circuit, the gate of said PMOS FET PF is connected to said internal node B, and the drain of said PMOS FET PF is connected to a voltage, Vlo, wherein said PMOS FET PF is one of said extra devices in said output stage.

17. The digital signal voltage level shifter of claim 16 wherein the drain of an NMOS FET NE is connected to said internal node D, the gate of said NMOS FET NE is connected to said primary output of the voltage level shifter circuit, and the source of said NMOS FET NE is connected to a voltage, Vlo.

18. The digital signal voltage level shifter of claim 17 wherein the drain of an NMOS FET NF is connected to said primary output of the voltage level shifter circuit, the gate of said NMOS FET NF is connected to said internal node D, and the source of said NMOS FET NF is connected to a voltage, Vlo.

19. The digital signal voltage level shifter of claim 18 wherein said NMOS FET NA and said NMOS FET NB and said PMOS FET PE and PMOS FET PF are used to help node voltages to increase or decrease.

20. The digital signal voltage level shifter of claim 18 wherein said NMOS FET NA and said NMOS FET NB and said PMOS FET PE and PMOS FET PF are used to allow the size of the other transistors of said voltage level shifter to be smaller.

21. The digital signal voltage level shifter of claim 20 wherein said voltage increasing or decreasing caused by NMOS FET NA and said NMOS FET NB and said PMOS FET PE and PMOS FET PF are used to reduce voltage bouncing on the nodes of said voltage level shifting circuit.

22. The digital signal voltage level shifter of claim 21 wherein said voltage increasing or decreasing caused by NMOS FET NA and said NMOS FET NB and said PMOS FET PE and PMOS FET PF are used to reduce latch-up problems which are caused by said voltage bouncing on the nodes of said voltage level shifting circuit.

23. A method of level shifting a digital signal voltage using a small circuit area and with low latch-up probability comprising the steps of:
   including an input stage inverter whose input is a primary input of said voltage level shifter and whose output goes to a middle stage inverter,
   including a middle stage inverter whose inputs come from said primary input and from the output of said input stage,
   including an output stage whose input is from an output of said middle stage and whose output is a primary output of said voltage level shifter,
   including said middle stage inverter further comprising two extra NMOS FET transistor devices to prevent latch-up and to reduce sizes of other devices in said middle stage inverter, and
   including said output stage further comprising two extra PMOS FET transistor devices to prevent latch-up and to reduce sizes of other devices in said output stage.

24. The method of level shifting a digital signal voltage of claim 23 wherein an NMOS FET NA, whose drain is connected to a power supply, Vhi, whose gate is connected to said primary input, and whose source is connected to an internal node B, an NMOS FET NB, whose drain is connected to said power supply, Vhi, whose gate is connected to an internal node A, and whose source is connected to an internal node C, a PMOS FET PE, whose drain is connected to a voltage, Vlo, whose gate is connected to said internal node C, and whose source is connected to an internal node D, and PMOS FET PF, whose drain is connected to said voltage, Vlo, whose gate is connected to an internal node B, and whose source is connected to said primary output, are used to help node voltages to increase or decrease.

25. The method of level shifting a digital signal voltage of claim 24 wherein said NMOS FET NA and said NMOS FET NB and said PMOS FET PE and PMOS FET PF are used to allow the size of the other transistors of said voltage level shifter to be smaller.

26. The method of level shifting a digital signal voltage of claim 25 wherein said voltage increasing or decreasing caused by NMOS FET NA and said NMOS FET NB and said PMOS FET PE and PMOS FET PF are used to reduce voltage bouncing on the nodes of said voltage level shifting circuit.

27. The method of level shifting a digital signal voltage of claim 26 wherein said voltage increasing or decreasing caused by NMOS FET NA and said NMOS FET NB and said PMOS FET PE and PMOS FET PF are used to reduce latch-up problems which are caused by said voltage bouncing on the nodes of said voltage level shifting circuit.

* * * * *